United States Patent
Sun et al.

(10) Patent No.: US 10,356,918 B2
(45) Date of Patent: Jul. 16, 2019

(54) CURVED-FLEXIBLE DISPLAY DEVICE

(71) Applicant: Wuhan China Star Optoelectronics Semiconductor Display Technology Co., Ltd., Wuhan (CN)

(72) Inventors: Yexi Sun, Wuhan (CN); Yilin Chen, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 114 days.

(21) Appl. No.: 15/558,190

(22) PCT Filed: Aug. 18, 2017

(86) PCT No.: PCT/CN2017/098156
§ 371 (c)(1),
(2) Date: Sep. 13, 2017

(87) PCT Pub. No.: WO2018/227753
PCT Pub. Date: Dec. 20, 2018

(65) Prior Publication Data
US 2019/0008054 A1    Jan. 3, 2019

(51) Int. Cl.
*G06F 1/16* (2006.01)
*H05K 5/00* (2006.01)
(Continued)

(52) U.S. Cl.
CPC ..... *H05K 5/0017* (2013.01); *G02F 1/133305* (2013.01); *G06F 1/16* (2013.01); *H05K 5/0217* (2013.01); *H05K 5/0221* (2013.01)

(58) Field of Classification Search
CPC .... G06F 1/1616; G06F 1/1652; G06F 1/1641; G06F 1/1637; G06F 1/1626; G06F 1/1633; H05K 5/0017; H05K 5/0221
(Continued)

(56) References Cited

U.S. PATENT DOCUMENTS 7,558,057 B1 *  7/2009  Naksen ................ G06F 1/1613
                                                        361/679.3
8,816,972 B2    8/2014  Solomon
(Continued)

FOREIGN PATENT DOCUMENTS

CN    104020879 A    9/2014
CN    104933964 A    9/2015
(Continued)

*Primary Examiner* — Anthony M Haughton
(74) *Attorney, Agent, or Firm* — Leong C. Lei

(57) ABSTRACT

The present invention provides a curved-flexible display device, which comprises a flexible display screen (1), a storage housing (3), and a limiting-fixing assembly (5). The flexible display screen (1) comprises an arc bending area (11) at an end side of the flexible display screen (1). The arc bending area (11) has a display and touch function as a human-computer interaction interface. The limiting-fixing assembly (5) comprises a first member (51) disposed on an outer surface of the storage housing (3), and a second member (53) disposed at a back surface of the arc bending area (11) and cooperated with the first member (51). The second member (53) has an arc shape and a curvature of the second member (53) is the same as a curvature of the arc bending area (11). When the storage housing (3) is storing the curved flexible display screen (1), the limiting-fixing assembly (5) adheres and fixes the arc bending area (11) to the outer surface of the storage housing (3), the user interaction experience is improved, production cost is reduced, and the appearance is more beautiful.

12 Claims, 6 Drawing Sheets

(51) Int. Cl.
*H05K 7/00* (2006.01)
*H05K 5/02* (2006.01)
*G02F 1/1333* (2006.01)

(58) Field of Classification Search
USPC .............. 361/679.01, 679.02, 679.21–679.3, 361/679.55, 679.56
See application file for complete search history.

(56) References Cited

U.S. PATENT DOCUMENTS

| | | | | |
|---|---|---|---|---|
| 2005/0040962 | A1* | 2/2005 | Funkhouser | G06F 1/1601 340/815.4 |
| 2016/0033999 | A1* | 2/2016 | Browning | G06F 1/1652 345/667 |
| 2016/0139633 | A1* | 5/2016 | Lee | G06F 1/1652 345/33 |
| 2016/0179141 | A1* | 6/2016 | Kim | G06F 1/1652 361/749 |
| 2017/0364122 | A1* | 12/2017 | Kim | G09F 9/301 |

FOREIGN PATENT DOCUMENTS

| | | |
|---|---|---|
| CN | 105308666 A | 2/2016 |
| CN | 105741683 A | 7/2016 |
| CN | 206021147 U | 3/2017 |

* cited by examiner

CURVED-FLEXIBLE DISPLAY DEVICE

BACKGROUND OF THE INVENTION

Field of Invention

The present invention relates to the field of liquid crystal display, and more particularly to a curved-flexible display device.

Description of Prior Art

In the field of display technology, the liquid crystal display (LCD) and the Organic Light Emitting Diode (OLED) have been gradually substituted for the Cathode Ray Tube (CRT) display.

Among them, with self-luminous, low driving voltage, high luminous efficiency, short response time, sharpness, high contrast, nearly 180° viewing angle, wide temperature range, flexible display and large area full color display and many other advantages, the OLED display has driven the development of flexible display technology.

In recent years, the development of flexible display technology has greatly promoted the future display technology to ahead for more lightweight and diversified. Curved flexible display devices have become one of the hot spots of the future display technology development, because the flexible display screen can be curvedly stored to maximize space-saving, and easy for users to carry with.

At present, some of the relevant patents have been reported, for example:

U.S. Patent No. 20150340004 and US20150047796 disclose a single-axis curved display device using a multi-screen design that provides a standby interactive screen and a display control interface by providing a single small screen and buttons on a curved storage housing, to achieve the interaction and control of the curved flexible screen. However, this will increase the difficulty of the process, and increase the overall cost.

Another U.S. patent No. US20160187929 sets the interaction area at the end of the curved screen so that the curved screen can display a partial function through the interaction area when it's stored. However, the end of the screen needs to be clamped with a special structure, showing as a protrusion state, affecting the overall beauty of the device, being inconvenient to grip, and having a smaller interaction area, so that users experience is declined.

Therefore, it is necessary to improve the conventional curved-flexible display device.

SUMMARY OF THE INVENTION

An object of the present invention is to provide a curved-flexible display device, which is capable of increasing the area of the human-computer interaction interface, improving the user interaction experience, reducing the difficulty of the process, reducing the production cost, making the appearance more beautiful, and significant improving the user's grip comfort.

In order to achieve the object, the present invention provides a curved-flexible display device, which comprises:

A flexible display screen, which comprises an arc bending area at an end side of the flexible display screen. The arc bending area has a display and touch function as a human-computer interaction interface.

A storage housing, which comprises a rotation mechanism for winding the flexible display screen. The storage housing is used for accommodating a curved flexible display screen.

A limiting-fixing assembly, which comprises a first member disposed on an outer surface of the storage housing, and a second member disposed at a back surface of the arc bending area at the end side of the flexible display screen and cooperated with the first member. The second member has an arc shape and a curvature of the second member is the same as a curvature of the arc bending area at the end of the flexible display screen.

When the storage housing is storing the curved flexible display screen, the limiting-fixing assembly adheres and fixes the arc bending area at the end side of the flexible display screen to the outer surface of the storage housing.

The storage housing comprises a slit-like opening for passing through the flexible display screen. The rotation mechanism in the storage housing is connected with a head side of the flexible display screen.

The storage housing is cylindrical.

The first member has an arc shape and a curvature of the first member is the same as the curvature of the second member.

Optional, the limiting-fixing assembly adheres and fixes the arc bending area at the end of the flexible display screen to the outer surface of the storage housing in the form of magnetic attraction. One of the first member and the second member is an iron plate, the other of the first member and the second member is a solenoid plate.

Optional, the limiting-fixing assembly adheres and fixes the arc bending area at the end of the flexible display screen to the outer surface of the storage housing in the form of Velcro. One of the first member and the second member is a Velcro loop side, the other of the first member and the second member is a Velcro hook side.

Optional, the limiting-fixing assembly adheres and fixes the arc bending area at the end of the flexible display screen to the outer surface of the storage housing in the form of mechanical buckle. The first member is a card slot and the second member is a catch.

An arc degree of the arc bending area at the end of the flexible display screen is 10°-180°.

The present invention further provides a curved-flexible display device, which comprises:

A flexible display screen, which comprises an arc bending area at an end side of the flexible display screen. The arc bending area has a display and touch function as a human-computer interaction interface.

A storage housing, which comprises a rotation mechanism for winding the flexible display screen. The storage housing is used for accommodating a curved flexible display screen.

A limiting-fixing assembly, which comprises a first member disposed on an outer surface of the storage housing, and a second member disposed at a back surface of the arc bending area at the end side of the flexible display screen and cooperated with the first member. The second member has an arc shape and a curvature of the second member is the same as a curvature of the arc bending area at the end of the flexible display screen.

When the storage housing is storing the curved flexible display screen, the limiting-fixing assembly adheres and fixes the arc bending area at the end side of the flexible display screen to the outer surface of the storage housing.

The storage housing comprises a slit-like opening for passing through the flexible display screen. The rotation mechanism in the storage housing is connected with a head side of the flexible display screen.

The storage housing is cylindrical.

The first member has an arc shape and a curvature of the first member is the same as the curvature of the second member.

An arc degree of the arc bending area at the end of the flexible display screen is 10°-180°.

The beneficial effects of the present invention are: the present invention provides a curved-flexible display device, which comprises a flexible display screen, a storage housing, and an limiting-fixing assembly. An arc bending area is disposed at an end side of the flexible display screen. The arc bending area has a display and touch function as a human-computer interaction interface. The limiting-fixing assembly comprises a first member disposed on an outer surface of the storage housing, and a second member disposed at a back surface of the arc bending area at the end side of the flexible display screen and cooperated with the first member. The second member has an arc shape and a curvature of the second member is the same as a curvature of the arc bending area at the end of the flexible display screen. When the storage housing is storing the curved flexible display screen, the limiting-fixing assembly adheres and fixes the arc bending area at the end side of the flexible display screen to the outer surface of the storage housing. Compared with the conventional multi-screen design, the present invention uses only one flexible display screen to realize the function of display and the interaction with the human-computer. One screen for multi-function can increase the material cost and reduce the difficulty of the process. The arc bending area at the end side of the flexible display screen can not only increase the area of human-computer interaction interface and improve the user interaction experience, but also can effectively reduce the occupied space after the flexible display screen is curved, so that curved-flexible display device has a much beautiful appearance, more portable, and significantly improve the user's grip comfort.

BRIEF DESCRIPTION OF THE DRAWINGS

For better understanding the technical proposals and other beneficial effects of the present invention, please refer the following detailed description of the present invention with the accompanying drawings.

In drawings.

DETAILED DESCRIPTION OF THE PREFERRED EMBODIMENTS

The technical proposals and the effects of the present invention will be described in further detail with reference to the below preferred embodiments of the present invention and their accompanying drawings.

Please refer to FIGS. 1, 2, 4 and 5, the present invention provides a curved-flexible display device, which comprises a flexible display screen 1, a storage housing 3, and a limiting-fixing assembly 5.

An arc bending area 11 is disposed at an end side of the flexible display screen 1. The arc bending area 11 has a display and touch function as a human-computer interaction interface.

Figure 6:
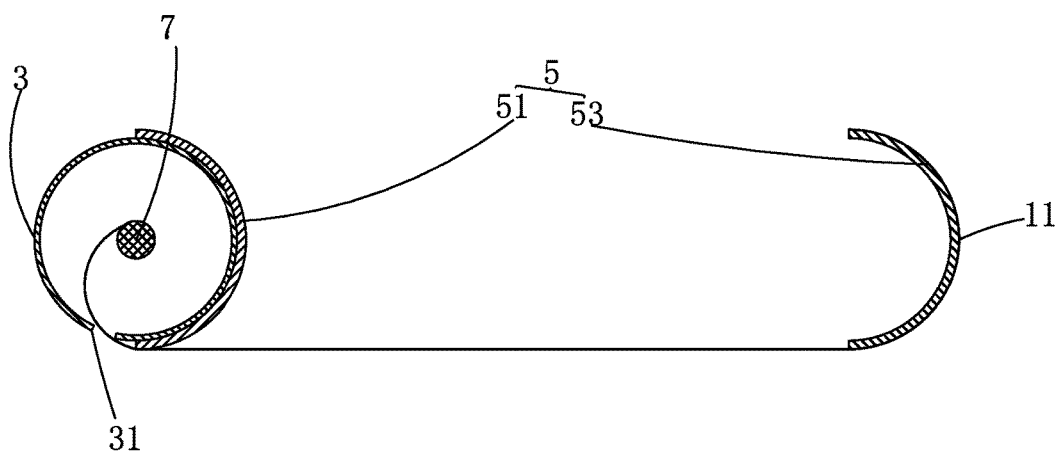
FIG. 6 is a cross-sectional illustrative view of an embodiment of a curved-flexible display device according to the present invention.

Please refer to FIG. 6, the storage housing 3 is provided with a rotation mechanism 7 including a rotating shaft and a power unit for driving the rotating shaft. The rotation mechanism 7 in the storage housing 3 is used for winding the flexible display screen 1, so that the flexible display screen 1 is in a curved state, and the storage housing 3 is for accommodating a curved flexible display screen 1. Specifically, the storage housing 3 is cylindrical; the storage housing 3 comprises a slit-like opening 31 for passing through the flexible display screen 1; the rotation mechanism 7 in the storage housing 3 is connected with a head side of the flexible display screen 1.

The limiting-fixing assembly 5 comprises a first member 51 disposed on an outer surface of the storage housing 3, and a second member 53 disposed at a back surface of the arc bending area 11 at the end side of the flexible display screen 1 and cooperated with the first member 51. The second member 53 has an arc shape and a curvature of the second member 53 is the same as a curvature of the arc bending area 11 at the end of the flexible display screen 1. Furthermore, the first member 51 has an arc shape and a curvature of the first member is the same as the curvature of the second member 53.

Figure 4:
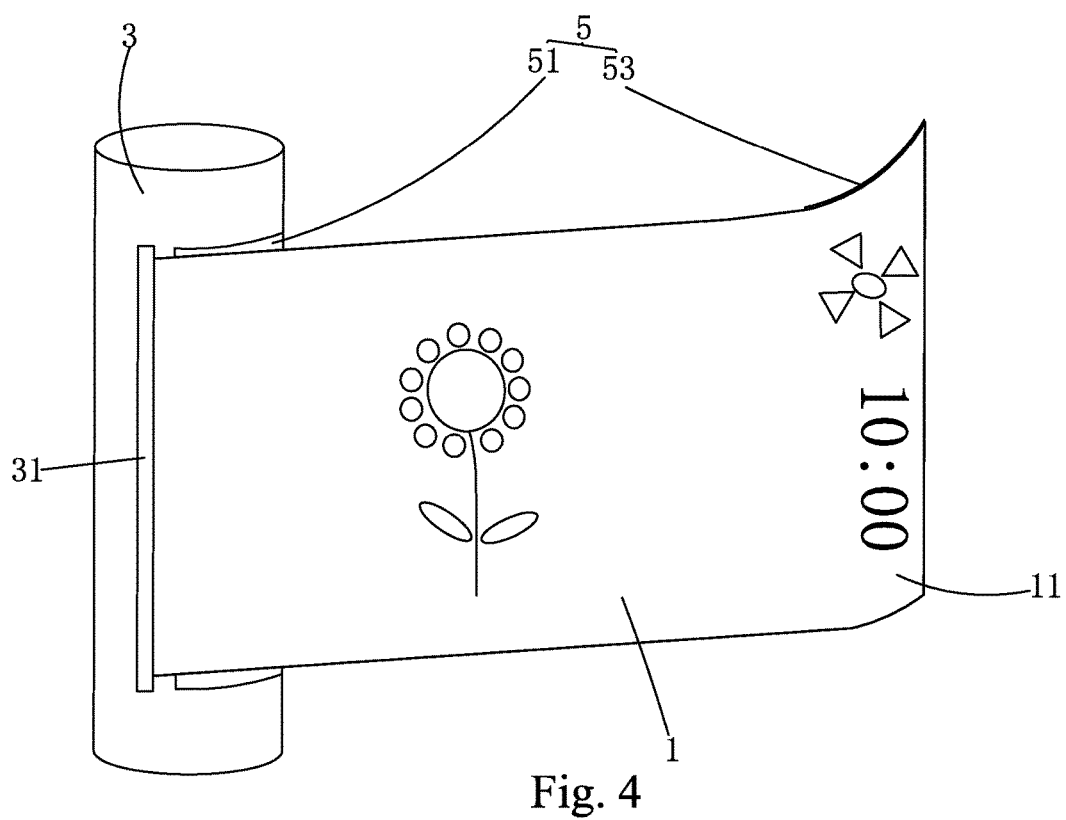
FIG. 4 is a three-dimensional structural view of a curved-flexible display device according to the present invention at an expanded state.

As shown in FIG. 4, when the curved-flexible display device of the present invention is in the expanded state, the flexible display screen 1 displays an image for viewing by the user at a main portion except the head side and the end side, the arc bending area 11 at the end side the flexible display screen 1, which is being the human-computer interaction interface, displays auxiliary information such as time, and performs the control operation of the users in a touch manner. Furthermore, the arc bending area 11 can also provide a grip point for the user when the flexible display panel 1 is pulled out from the storage housing 3.

Figure 5:
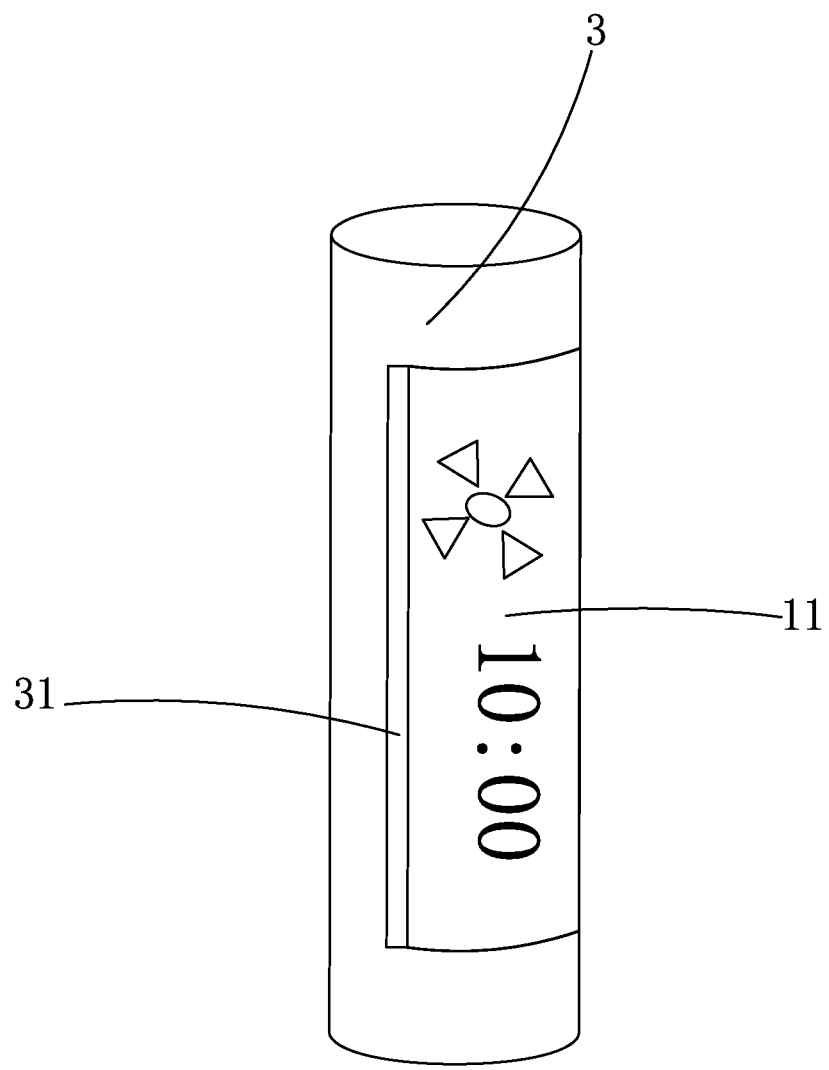
FIG. 5 is a three-dimensional structural view of a curved-flexible display device according to the present invention at a curved state.

As shown in FIG. 5, when the housing 3 accommodates the curved-flexible display screen 1, the limiting-fixing assembly 5 adheres and fixes the arc bending area 11 at the end side of the flexible display screen 1 to the outer surface of the storage housing 3, to be continuously used as the human-computer interaction interface.

Figure 1:
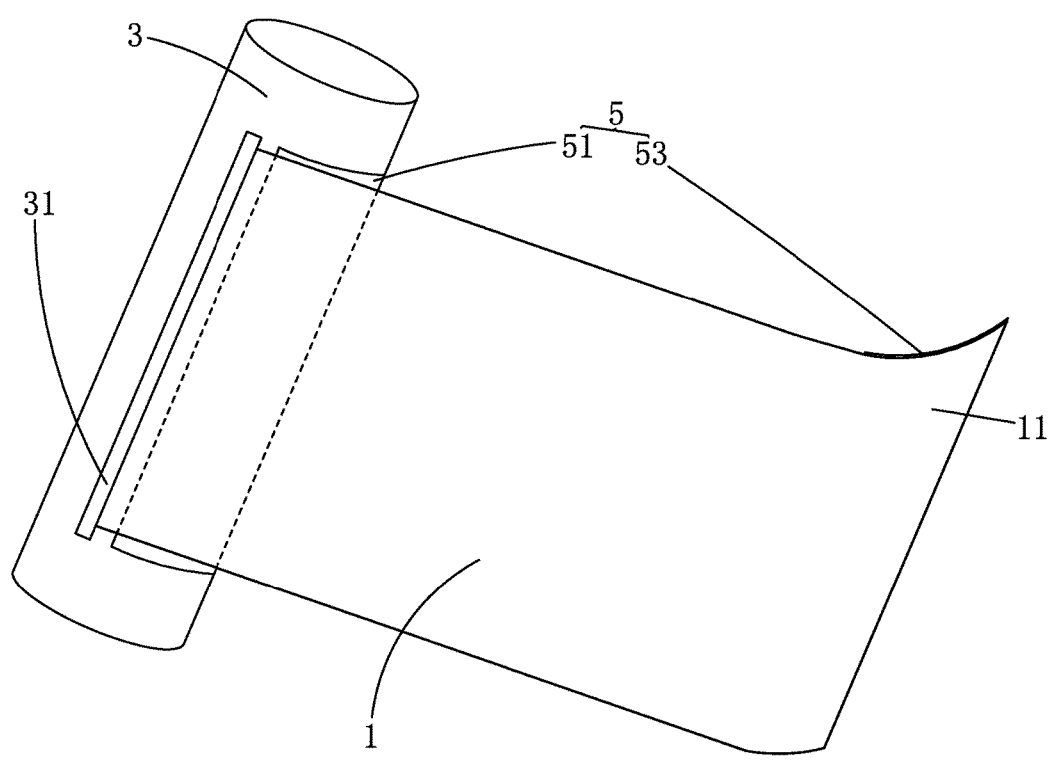
FIG. 1 is a three-dimensional structural view of a curved-flexible display device according to the present invention.
Figure 2:
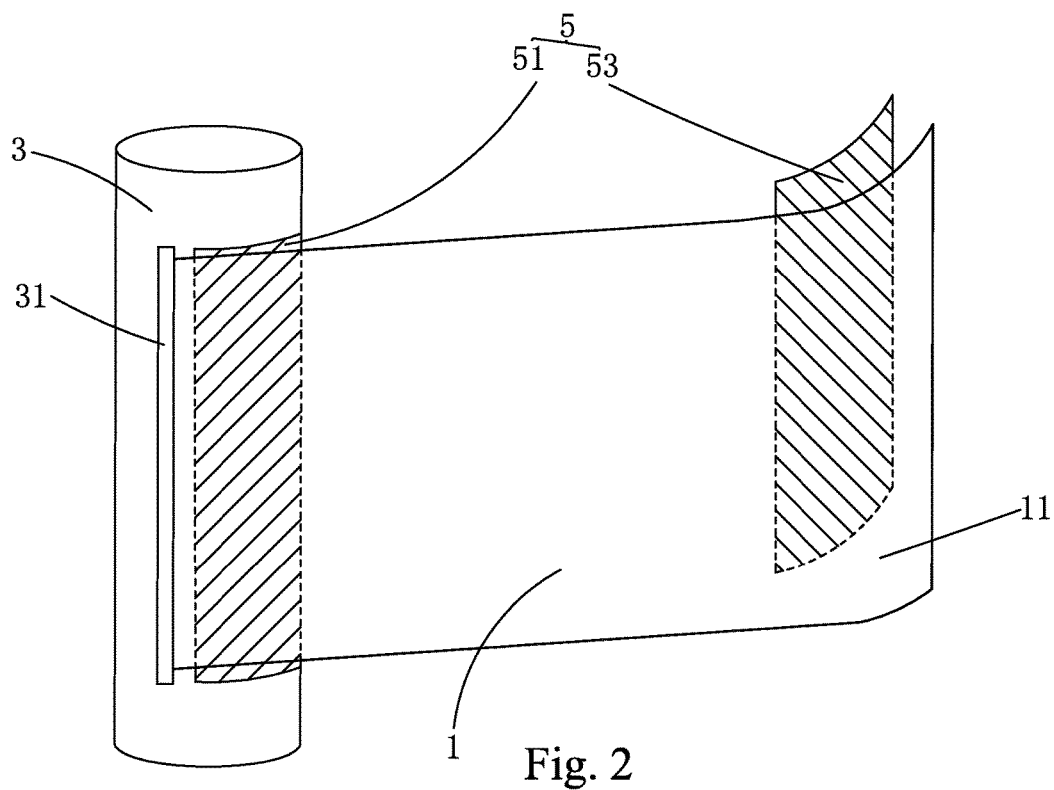
FIG. 2 is a three-dimensional decomposition view of a curved-flexible display device according to the present invention.
Figure 3A:
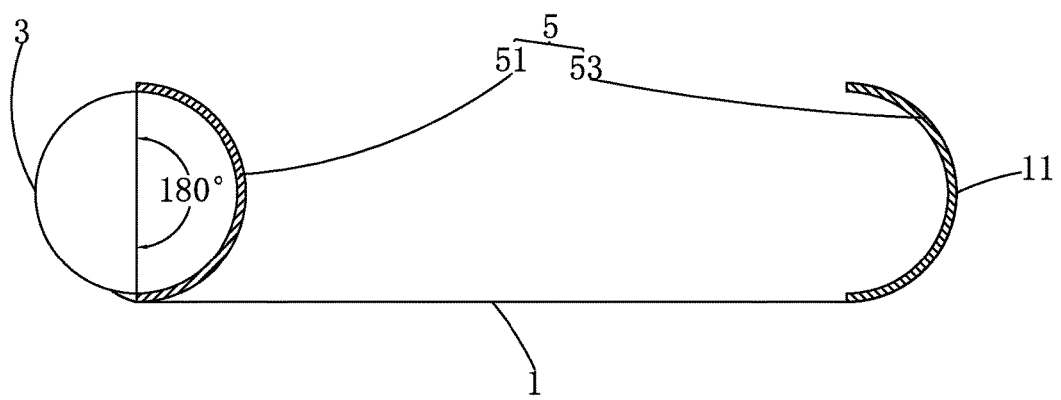
FIG. 3A is a top-viewing illustrative view of an embodiment of a curved-flexible display device according to the present invention.
Figure 3B:
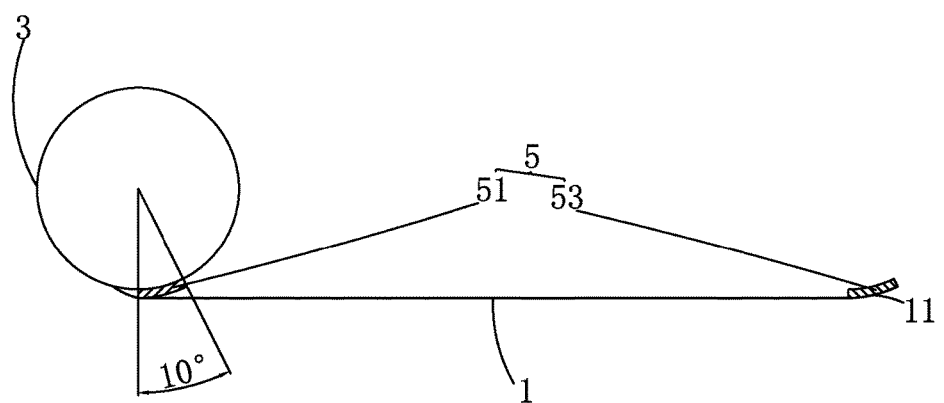
FIG. 3B is a top-viewing illustrative view of another embodiment of a curved-flexible display device according to the present invention.

Please refer to FIGS. 3A and 3B, the curvature of the arc bending area 11 at the end side of the flexible display screen 1 can be selected between 10° and 180°. The larger the selected curvature is, the larger the area of the arc bending area 11 at the end side of the flexible display screen 1 (as the human-machine interaction interface) is.

Compared with the conventional multi-screen design, the curved-flexible display device of the present invention uses only one flexible display screen 1 to realize the function of display and the interaction with the human-computer. One screen for multi-function can increase the material cost and reduce the difficulty of the process. The arc bending area 11 at the end side of the flexible display screen 1 can not only increase the area of human-computer interaction interface and improve the user interaction experience, but also can effectively reduce the occupied space after the flexible display screen 1 is curved, so that curved-flexible display device has a much beautiful appearance, more portable, and significantly improve the user's grip comfort.

Specifically, the limiting-fixing assembly 5 adheres and fixes the arc bending area 11 at the end of the flexible display screen 1 to the outer surface of the storage housing 3 in the form of magnetic attraction. One of the first member 51 and the second member 53 is an iron plate, the other of the first member 51 and the second member 53 is a solenoid plate.

For example, the first member 51 is an iron plate and the second member 53 is a solenoid plate. When it is necessary to pull the curved flexible display screen 1 out of the storage housing 3, the user touches a touch area corresponding to the arc bending area 11 at the end side of the flexible display screen 1 (as the human-machine interaction interface), to send a signal to let the second member 53 of the solenoid plate be power-off, then, the attraction force between the solenoid plate and the iron plate (the first member 51) is disappear, the flexible display screen 1 can be expanded by holding the arc bending area 11 at the end of the flexible display screen 1. On the other hand, after the flexible display screen 1 is curved and stored, the user touches a touch area corresponding to the arc bending area 11 at the end of the flexible display screen 1 (as the human-computer interface), to send a signal to let of the solenoid plate (the second member 53) be power-on, then, the solenoid plate and the iron plate (the first member 51) are attracted to each other, then, the arc bending area 11 at the end of the flexible display screen 1 is adhered and fixed to the outer surface of the storage housing 3.

The limiting-fixing assembly 5 can also adhere and fix the arc bending area 11 at the end of the flexible display screen 1 to the outer surface of the storage housing 3 in the form of Velcro. One of the first member 51 and the second member 53 is a Velcro loop side, the other of the first member 51 and the second member 53 is a Velcro hook side. The user can manually perform a pull operation or an attaching operation to the Velcro, so as to realize the expanded status of the flexible display screen 1, or the adherence and fixation of the flexible display screen 1 to the outer surface of the storage housing 3 after the flexible display screen 1 is curved and accommodated.

The limiting-fixing assembly 5 can also adhere and fix the arc bending area 11 at the end of the flexible display screen 1 to the outer surface of the storage housing 3 in the form of mechanical buckle. The first member 51 is a card slot and the second member 53 is a catch. The user can manually perform a separating operation or an inserting operation to the buckle, so as to realize the expanded status of the flexible display screen 1, or the adherence and fixation of the flexible display screen 1 to the outer surface of the storage housing 3 after the flexible display screen 1 is curved and accommodated.

As mentioned above, those of ordinary skill in the art, without departing from the spirit and scope of the present invention, can make various kinds of modifications and variations to the present invention. Therefore, all such modifications and variations are intended to be included in the protection scope of the appended claims of the present invention.

What is claimed is:
1. A curved-flexible display device, comprising:
 a flexible display screen, comprising an arc bending area at an end side of the flexible display screen, the arc bending area having a display and touch function as a human-computer interaction interface;
 a storage housing, comprising a rotation mechanism for winding the flexible display screen, the storage housing for accommodating a curved flexible display screen; and
 an limiting-fixing assembly, comprising a first member disposed on an outer surface of the storage housing, and a second member disposed at a back surface of the arc bending area at the end side of the flexible display screen and cooperated with the first member; the second member having an arc shape and a curvature of the second member being the same as a curvature of the arc bending area at the end of the flexible display screen; when the storage housing storing the curved flexible display screen, the limiting-fixing assembly attaching and fixing the arc bending area at the end side of the flexible display screen to the outer surface of the storage housing.

2. The curved-flexible display device according to claim 1, wherein the storage housing comprises a slit-like opening for passing through the flexible display screen; the rotation mechanism in the storage housing is connected with a head side of the flexible display screen.

3. The curved-flexible display device according to claim 2, wherein the storage housing is cylindrical.

4. The curved-flexible display device according to claim 1, wherein the first member has an arc shape and a curvature of the first member is the same as the curvature of the second member.

5. The curved-flexible display device according to claim 4, wherein the limiting-fixing assembly adheres and fixes the arc bending area at the end of the flexible display screen to the outer surface of the storage housing in the form of magnetic attraction, one of the first member and the second member is an iron plate, the other of the first member and the second member is a solenoid plate.

6. The curved-flexible display device according to claim 4, wherein the limiting-fixing assembly adheres and fixes the arc bending area at the end of the flexible display screen to the outer surface of the storage housing in the form of Velcro, one of the first member and the second member is an Velcro loop side, the other of the first member and the second member is a Velcro hook side.

7. The curved-flexible display device according to claim 1, wherein the limiting-fixing assembly adheres and fixes the arc bending area at the end of the flexible display screen to the outer surface of the storage housing in the form of mechanical buckle, the first member is a card slot and the second member is a catch.

8. The curved-flexible display device according to claim 1, wherein an arc degree of the arc bending area at the end of the flexible display screen is 10°-180°.

9. A curved-flexible display device, comprising:
 a flexible display screen, comprising an arc bending area at an end side of the flexible display screen, the arc bending area having a display and touch function as a human-computer interaction interface;
 a storage housing, comprising a rotation mechanism for winding the flexible display screen, the storage housing for accommodating a curved flexible display screen; and
 an limiting-fixing assembly, comprising a first member disposed on an outer surface of the storage housing, and a second member disposed at a back surface of the arc bending area at the end side of the flexible display screen and cooperated with the first member; the second member having an arc shape and a curvature of the second member being the same as a curvature of the arc bending area at the end of the flexible display screen;

when the storage housing storing the curved flexible display screen, the limiting-fixing assembly attaching and fixing the arc bending area at the end side of the flexible display screen to the outer surface of the storage housing;

wherein the storage housing comprises a slit-like opening for passing through the flexible display screen; the rotation mechanism in the storage housing is connected with a head side of the flexible display screen;

wherein the storage housing is cylindrical;

wherein the first member has an arc shape and a curvature of the first member is the same as the curvature of the second member;

wherein an arc degree of the arc bending area at the end of the flexible display screen is 10°-180°.

10. The curved-flexible display device according to claim 9, wherein the limiting-fixing assembly adheres and fixes the arc bending area at the end of the flexible display screen to the outer surface of the storage housing in the form of magnetic attraction, one of the first member and the second member is an iron plate, the other of the first member and the second member is a solenoid plate.

11. The curved-flexible display device according to claim 9, wherein the limiting-fixing assembly adheres and fixes the arc bending area at the end of the flexible display screen to the outer surface of the storage housing in the form of Velcro, one of the first member and the second member is an Velcro loop side, the other of the first member and the second member is a Velcro hook side.

12. The curved-flexible display device according to claim 9, wherein the limiting-fixing assembly adheres and fixes the arc bending area at the end of the flexible display screen to the outer surface of the storage housing in the form of mechanical buckle, the first member is a card slot and the second member is a catch.

* * * * *